US010128438B2

(12) United States Patent
Reid et al.

(10) Patent No.: US 10,128,438 B2
(45) Date of Patent: Nov. 13, 2018

(54) CEM SWITCHING DEVICE

(71) Applicant: ARM Limited, Cambridge (GB)

(72) Inventors: Kimberly Gay Reid, Austin, TX (US); Lucian Shifren, San Jose, CA (US); Carlos Alberto Paz de Araujo, Colorado Springs, CO (US); Jolanta Bozena Celinska, Colorado Springs, CO (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/260,515

(22) Filed: Sep. 9, 2016

(65) Prior Publication Data
US 2018/0076388 A1 Mar. 15, 2018

(51) Int. Cl.
*H01L 45/00* (2006.01)

(52) U.S. Cl.
CPC ............ *H01L 45/146* (2013.01); *H01L 45/04* (2013.01); *H01L 45/1608* (2013.01); *H01L 45/1616* (2013.01); *H01L 45/1641* (2013.01)

(58) Field of Classification Search
CPC .......................... H01L 45/146; H01L 45/1616
USPC ......... 257/2, 5; 365/148; 438/382, 132, 102, 438/148
See application file for complete search history.

(56) References Cited

U.S. PATENT DOCUMENTS

| | | | |
|---|---|---|---|
| 9,589,636 B1 | 3/2017 | Bhavnagarwala | |
| 9,627,615 B1 | 4/2017 | Reid | |
| 9,660,189 B1 | 5/2017 | Reid | |
| 9,735,360 B2 | 8/2017 | Shifren | |
| 9,773,550 B2 | 9/2017 | Bhavnagarwala | |
| 2008/0106925 A1 | 5/2008 | Paz de Araujo | |
| 2008/0106926 A1* | 5/2008 | Brubaker | H01L 27/2409 365/148 |
| 2008/0106927 A1 | 5/2008 | Celinska | |
| 2008/0107801 A1 | 5/2008 | Celinska | |
| 2009/0104756 A1 | 4/2009 | Kumar | |
| 2010/0207093 A1 | 8/2010 | Inoue et al. | |
| 2010/0237317 A1 | 9/2010 | Tsunoda | |
| 2012/0113706 A1 | 5/2012 | Stanley et al. | |
| 2013/0248801 A1 | 9/2013 | Yamamoto | |
| 2014/0113428 A1 | 4/2014 | Lin et al. | |
| 2014/0231743 A1 | 8/2014 | Ramaswamy et al. | |
| 2014/0301127 A1 | 10/2014 | Kim et al. | |
| 2015/0129816 A1 | 5/2015 | Wang | |
| 2017/0092858 A1 | 3/2017 | Shifren | |
| 2017/0117043 A1 | 4/2017 | Sandhu | |
| 2017/0147207 A1 | 5/2017 | Hansson | |

FOREIGN PATENT DOCUMENTS

WO WO2009140305 11/2009
WO WO2017/239972 8/2017

* cited by examiner

*Primary Examiner* — Bo Fan
(74) *Attorney, Agent, or Firm* — Leveque IP Law, P.C.

(57) ABSTRACT

Subject matter herein disclosed relates to a method for the manufacture of a CEM switching device providing that the CEM layer comprises a doped metal compound substantially free from metal wherein ions of the same metal element are present in different oxidation states. The method may provide a CEM layer which is born on and capable of switching with operating voltages below 2.0V.

11 Claims, 5 Drawing Sheets

CEM SWITCHING DEVICE

FIELD OF THE INVENTION

The present disclosure relates to a switching device comprising a correlated electron material (CEM) layer and to methods for the manufacture of the device.

BACKGROUND

Electronic switching devices are found in a wide variety of electronic device types, such as computers, digital cameras, cellular telephones, tablet devices, personal digital assistants and so forth, where they may function as memory and/or logic devices.

Factors of interest to a designer in considering whether a particular electronic switching device is suitable for such a function, may include physical size, storage density, operating voltages, impedance ranges, and/or power consumption. Other factors of interest may include cost of manufacture, ease of manufacture, scalability and/or reliability.

DETAILED DESCRIPTION

There appears to be an ever-increasing drive towards memory and/or logic devices exhibiting lower power and/or higher speed. Switching devices comprising a CEM are at the forefront of this drive not just because they can exhibit low power and/or high speed but also because they are generally reliable and easily and cheaply manufactured.

The present disclosure describes methods for the manufacture of a switching device based upon a silicon-containing CEM. The CEM switching device may, for example, find application as a correlated electron random access memory (CERAM) in memory and/or logic devices which may be used with a wide range of electronic circuit types, such as memory controllers, memory arrays, filter circuits, data converters, optical instruments, phase locked loop circuits, microwave and millimeter wave transceivers, and so forth.

A CEM switching device can exhibit a rapid conductor-to-insulator transition as compared to other switching devices because the switching is brought about by an electron correlation rather than by a solid state structural phase change or by formation of filaments, as is found respectively in phase change memory devices and resistive RAM devices.

The rapid conductor-to-insulator transition of a CEM switching device may, in particular, be responsive to a quantum mechanical phenomenon in contrast to the melting/solidification or filament formation found respectively in phase change and resistive RAM devices. The quantum mechanical transition in a CEM switching device between a relatively conductive state and a relatively insulative state (or between a first impedance state and a second impedance state) may occur in several ways.

In one respect, a quantum mechanical transition of a CEM between a relatively insulative/higher impedance state and a relatively conductive/lower impedance state may be understood in terms of a Mott transition. In accordance with a Mott transition, a material may switch from a relatively insulative/higher impedance state to a relatively conductive/lower impedance state if a Mott transition condition is satisfied. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state).

In another respect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

The switching from a relatively insulative/higher impedance state to a relatively conductive/lower impedance state may bring about a change in capacitance in addition to a change in resistance. For example, a CEM switch may exhibit a variable resistance together with a property of variable capacitance. In other words, impedance characteristics of a CEM switch may include both resistive and capacitive components. For example, in a metal state, a CEM switch may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM switch may result in changes in both resistance and capacitance.

A switching device formed from a CEM may exhibit switching of impedance states responsive to a Mott-transition in a majority of the volume of the CEM comprising the device. The CEM may, in particular, form a "bulk switch". As used herein, the term "bulk switch" refers to at least a majority volume of a CEM switching a device's impedance state, such as in response to a Mott-transition. For example, substantially all CEM of a device may switch from a relatively insulative/higher impedance state to a relatively conductive/lower impedance state or from a relatively conductive/lower impedance state to a relatively insulative/higher impedance state responsive to a Mott-transition.

In one arrangement, shown in FIG. 1, a CEM switching device may comprise a CEM layer sandwiched between a conductive substrate and a conductive overlay. In this arrangement, the CEM switching device can act as memory storage element. In other arrangements, the CEM switching device may comprise either a CEM layer provided on a conductive substrate or a CEM layer provided with a conductive overlay. In these other arrangements, the device comprises source and a drain regions providing for a flow of current across the device.

Referring now to FIG. 1A, a current density versus voltage profile 100 of a CEM switching device is shown which illustrates its switching behaviour. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM switching device to a relatively low-impedance memory state. Conversely, application of a voltage $V_{reset}$ and a current density $J_{reset}$ may bring about a transition of the CEM device to a relatively high-impedance memory state.

As shown in FIG. 1A, reference designator 110 illustrates the voltage range that may separate $V_{set}$ from $V_{reset}$. Following placement of the CEM switching device into a high-impedance state or a low-impedance state, the particular state of the CEM switching device may be detected by application of a voltage $V_{read}$ (e.g., during a read operation) and detection of a current or current density at terminals of the CEM switching device (e.g., utilizing read window 107).

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM switching device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material.

If the CEM switching device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain devices, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

The current in a CEM switching device may be controlled by an externally applied "compliance" condition, which may be determined at least partially on the basis of an applied external current, which may be limited during a write operation, for example, to place the CEM device into a relatively high-impedance state. This externally-applied compliance current may, in some devices, also set a condition of a current density for a subsequent reset operation to place the CEM device into a relatively high-impedance state. As shown in the particular device of FIG. 1A, a current density $J_{comp}$ may be applied during a write operation at point 116 to place the CEM switching device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

The compliance may, in particular, set a number of electrons in a CEM switching device which may be "captured" by holes for the Mott transition. In other words, a current applied in a write operation to place a CEM device into a relatively low-impedance memory state may determine a number of holes to be injected to the CEM device for subsequently transitioning the CEM switching device to a relatively high-impedance memory state.

As pointed out above, a reset condition may occur in response to a Mott transition at point 108. Such a Mott transition may bring about a condition in the CEM switching device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 26 \tag{1}$$
$$n = \left(\frac{C}{\lambda_{TF}}\right)^3$$

wherein $\lambda_{TF}$ corresponds to a Thomas Fermi screening length, and C is a constant.

A current or current density in region 104 of the voltage versus current density profile shown in FIG. 1A, may exist in response to injection of holes from a voltage signal applied across terminals of the CEM switching device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \tag{2}$$
$$Q(V_{MI}) = qn(V_{MI})$$

wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \tag{3}$$
$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

wherein $A_{CEM}$ is a cross-sectional area of a CEM switching device; and $J_{reset}(V_{MI})$ may represent a current density through the CEM switching device to be applied to the CEM switching device at a threshold voltage $V_{MI}$, which may place the CEM switching device into a relatively high-impedance state.

FIG. 1B shows a CEM switching device 150 comprising a CEM layer 160 sandwiched between a conductive substrate 170 and a conductive overlay 180 and a schematic diagram of an equivalent circuit for the switching device.

As previously mentioned, the CEM switching device may exhibit characteristics of both variable resistance and variable capacitance. In other words, the CEM switching device may be considered as a variable impedance device in which the impedance depends at least in part on resistance and capacitance characteristics of the device if measured across device terminals 190 and 190'. The equivalent circuit for a variable impedance device may comprise a variable resistor 192, such as variable resistor, in parallel with a variable capacitor 194. Of course, although a variable resistor and variable capacitor are depicted in FIG. 1B as comprising discrete components, the variable impedance device, such as that shown, may comprise a substantially homogenous CEM.

Table 1 below depicts an example truth table for an example variable impedance device, such as the device of FIG. 1A.

TABLE 1

Correlated Electron Switch Truth Table

| Resistance | Capacitance | Impedance |
|---|---|---|
| $R_{high}$ ($V_{applied}$) | $C_{high}$ ($V_{applied}$) | $Z_{high}$ ($V_{applied}$) |
| $R_{low}$ ($V_{applied}$) | $C_{low}$ ($V_{applied}$)~0 | $Z_{low}$ ($V_{applied}$) |

Table 1 shows that a resistance of a variable impedance device, such as that shown, may transition between a low-impedance state and a substantially dissimilar, high-impedance state as a function at least partially dependent on a voltage applied across the CEM switching device. The impedance exhibited at a low-impedance state may, for example, be approximately in the range of 10.0-100,000.0 times lower than an impedance exhibited in a high-impedance state. However, the impedance exhibited at a low-impedance state may be approximately in the range of 5.0 to 10.0 times lower than an impedance exhibited in a high-impedance state. Table 1 also shows that a capacitance of a variable impedance device, such as the device shown, may transition between a lower capacitance state, which may, for example comprise an approximately zero, or very little, capacitance, and a higher capacitance state that is a function, at least in part, of a voltage applied across the CEM switching device.

The CEM switching device may be placed into a relatively low-impedance memory state, such as by transitioning from a relatively high impedance state, for example, via injection of a sufficient quantity of electrons to satisfy a Mott transition criteria. In transitioning a CEM switching device to a relatively low-impedance state, if enough electrons are injected and the potential across the terminals of the CEM device overcomes a threshold switching potential (e.g., $V_{set}$), injected electrons may begin to screen. As previously mentioned, screening may operate to delocalize double-occupied electrons to collapse the band-splitting potential, thereby bringing about a relatively low-impedance state.

The present disclosure relates to a method for the manufacture of a CEM switching device which forms a CEM layer comprising a doped metal compound having more than one metal ion of the same metal element without the occurrence of significant amounts of free metal. The presence of ions of different oxidation states in the same metal element and the absence of free metal may provide that the switching of the CEM layer is wholly governed by electron localisation and delocalisation and/or that it occurs within desirable operating voltages (for example, those at 2.0V or below).

The method may also form the CEM layer with a high level of doping and, in particular, provide a level of dopant which is greater than 10% when the device is fully formed. Such levels of doping may be difficult to obtain because the manufacture of a fully formed device involves processing steps, such as etching, which follow the formation of the CEM layer and may consume the dopant in the CEM layer.

Accordingly, in a first aspect, the present disclosure provides a method for the manufacture of a CEM switching device, which method comprises forming a layer of a correlated electron material (CEM) comprising a doped metal compound substantially free from metal wherein ions of the same metal element are present in different oxidation states. The CEM layer may, in particular, comprise less than 5 atom % or less than 2 atom % free metal—but in some embodiments, free metal is not present in the CEM layer within detectable limits obtainable by X-ray photoelectron spectroscopy.

In a particular embodiment, suitable for forming a CeRAM, the method comprises forming a conductive substrate, forming a CEM layer on or over the conductive substrate and forming a conductive overlay on the CEM layer, wherein the forming of the CEM layer comprises forming a doped metal compound substantially free from metal wherein ions of the same metal element are present in different oxidation states.

In some embodiments, the method comprises forming a CEM layer comprising a doped metal compound having two or three different ions of the same metal viz., in two or three different oxidation states. In these embodiments, the different oxidation states may be +1, +2 and +3 or +2 and +3 but other oxidation states such as +1, +3 and +5 are possible. Note that the difference in oxidation states need not be monotonic and that the concentrations of the metal ions of different oxidation states in the metal compound need not be equal but may differ, for example, in ratio approximating to 3:2, 4:3, 2:1 or more.

The method may form a CEM layer comprising a doped metal compound of a d- or f-block element (especially one exhibiting an incomplete d- or f-electron shell) such as nickel, cobalt, iron, yttrium or ytterbium. It may comprise forming a CEM layer comprising an oxide of a d- or f-block element and, in particular, a transition metal oxide (TMO) such as nickel oxide, cobalt oxide, iron oxide or an oxide of a rare earth element such as yttrium oxide. The method may alternatively comprise forming a CEM layer comprising a complex (or "mixed") oxide of d- and/or f-block elements, for example, as a perovskite such as chromium doped strontium titanate, lanthanum titanate, praseodymium calcium manganate or praseodymium lanthanum manganite or a complex oxide of a rare earth element and a transition metal such as yttrium titanium oxide or ytterbium titanium oxide.

In a particular embodiment, the method comprises forming the CEM layer as a doped metal compound comprising two or three different ions of the same metal with oxidation states of +1, +2 and +3 or with oxidation states +2 and +3. The method may, for example, form the CEM layer as a doped transition metal oxide such as nickel oxide (NiO:dopant) with nickel ions $Ni^+$, $Ni^{2+}$ and $Ni^{3+}$ or with nickel ions $Ni^{2+}$ and $Ni^{3+}$.

In one embodiment, therefore, the method comprises forming the CEM layer as a doped nickel oxide (NiO:dopant) wherein the nickel $2p_{3/2}$ envelope obtained by X-ray photoelectron spectroscopy of the CEM layer is substantially absent a peak corresponding to nickel metal (at 852.4 to 853.1 eV, for example). The method may, in particular, form a nickel oxide (NiO:dopant) having a nickel $2p_{3/2}$ envelope obtained by X-ray photoelectron spectroscopy of the CEM layer substantially similar to that shown in FIG. 2. In this embodiment, the oxygen is envelope obtained by X-ray photoelectron spectroscopy of the CEM layer may be substantially similar to that shown in FIG. 3.

In another embodiment, the method comprises forming a CEM layer comprising a doped metal compound having two or three different ions of more than one metal. The method may, for example, form the CEM layer as a doped yttrium titanium oxide ($Y_xTi_yO$:dopant) with yttrium ions $Y^{2+}$, $Y^{3+}$ and titanium ions $Ti^{2+}$ $Ti^{3+}$ or with yttrium ions $Y^+$, $Y^{2+}$, $Y^{3+}$ and titanium ions $Ti^+$, $Ti^{2+}$, $Ti^{3+}$. Note that the oxidations states for ions of the different metals need not correspond and that other oxidation states such as $Ti^{4+}$ may also be utilised.

The method may comprise forming of the CEM layer with a dopant which can donate electrons to the metal compound. Such "back-donating" may provide that the CEM layer exhibits the property of a controllable and reversible donation of electrons to a conduction band of the metal compound during operation of the device—thus permitting the metal compound to switch between a relatively conductive state and a relatively insulative state.

Suitable dopant precursors for back donating dopants may comprise carbon monoxide (CO), ammonia ($NH_3$) or amine ($NR_3$, R=H or alkyl or aryl), such as ethylene diamine ($C_2H_8N_2$), as well as nitrogen oxides of formula $N_xO_y$, viz., nitrous oxide, nitric oxide or nitrogen dioxide.

Other suitable back donating dopants may arise from an organometallic precursor for the metal compound comprising one or more of a carbon-containing ligand, a nitrogen-containing ligand, a phosphorus-containing ligand or a sulfur-containing ligand. Such ligands include carbonyl (—CO), chloro (—Cl), amine (—$NH_3$), alkyl amide (—$NR_3$), sulphide (—SR) and phosphine (—$PR_3$ R=aryl, for example, phenyl) as well as more complex ligands such as amidinate (AMD), cyclopentadienyl (Cp), methylcyclopentadienyl (MeCp), ethylcyclopentadienyl (EtCp), pentamethylcyclopentadienyl ($Me_5Cp$), 2,2,6,6-tetramethylheptane-3,5-dionato (thd), acetylacetonate (acac), methylglyoximate (dmg), 2-amino-pent-2-en-4-onato (apo), 1-dimethylamino-2-methyl-2-butanolate (dmamb), 1-dimethylamino-2-methyl-2-propanolate (dmamp).

In a particular embodiment, the method comprises forming a CEM layer comprising a doped metal compound wherein the content of carbon or nitrogen (for example) is between 1 atom % and 20 atom %, in particular, between 5 atom % and 20 atom %, for example, 10 atom % or 15 atom % or over. In one such embodiment, the method may comprise forming the CEM layer as a doped nickel oxide (NiO:dopant) or a doped yttrium titanium oxide ($Y_xTi_yO$: dopant) wherein the dopant derives from carbon monoxide gas or from a carbonyl (—CO) ligand.

The method may, therefore, comprise forming the CEM layer as nickel oxide (NiO:CO) wherein the nickel $2p_{3/2}$ envelope obtained by X-ray photoelectron spectroscopy of the CEM layer is substantially similar to that shown in FIG. 2, the oxygen is envelope obtained by X-ray photoelectron spectroscopy of the CEM layer is substantially similar to that shown in FIG. 3 and the carbon is envelope obtained by X-ray photoelectron spectroscopy is substantially similar to that shown in FIG. 4.

The method may comprise forming the CEM layer as a "born on" CEM layer viz., a CEM layer that is formed in its comparatively conductive (low resistance) state. In one embodiment, the method forms the doped nickel oxide (NiO:CO) described by FIGS. 2 to 4 as a born on CEM layer.

Note that this CEM layer has two different nickel ions in oxidation states +2 and +3 and contains no nickel metal. These different oxidation states of nickel ion may be associated with different conducting (or insulative states) in the CEM layer. In particular, the switching of the CEM layer from its relatively conducting state to its relatively insulating state may be associated with a disproportionation of nickel ions in oxidation state +2 to nickel ions in oxidation states +1 and +3 ($Ni^{2+}=Ni^++Ni^{3+}$. Conversely, the switching of the CEM layer from its relatively insulating state to its relatively conducting state may be associated with a comproportionation of nickel ions in oxidation states +1 and +2 to nickel ions in oxidation state +2 ($Ni^++N^{3+}=Ni^{2+}$. In that case, nickel ion in oxidation state +1 will not appear in the CEM layer until the device has been "set" by switching for the first time.

Note further that a CEM layer comprising two or three different ions of more than one metal may switch through concomitant disproportionation and/or comproportionation of ions of both metals. The switching of the CEM layer from its relatively conducting state to its relatively insulating state may, in particular, be associated with a disproportionation of an ion of a first metal (Y, for example) and a disproportionation of an ion of a second metal (Ti, for example). Conversely, the switching of the CEM layer from its relatively insulating state to its relatively conducting state may be associated with a comproportionation of an ion of a first metal (Y, for example) as well as a comproportionation of an ion of a second metal (Ti, for example).

The method may comprise a physical vapour deposition or a chemical vapour deposition, and in particular, atomic layer deposition, laser or plasma enhanced atomic layer deposition, laser or plasma enhanced chemical vapour deposition, rapid thermal or hot wire chemical vapour deposition, electron or ion beam chemical vapour deposition, cathodic arc chemical vapour deposition, sputtering, ion beam sputtering and reactive sputtering, ion plating and the like.

The method may comprise forming the CEM layer by depositing a layer of a doped metal compound from an organometallic precursor or by forming a layer of a doped metal compound from a metal or organometallic precursor in an atmosphere comprising a reactant such as an oxidising agent and a dopant precursor. The method may further comprise annealing so as to improve the CEM properties of the deposited layer.

Alternatively, the method may comprise forming the CEM layer by depositing a layer of a metal compound and subsequently treating it to incorporate a dopant. The treatment may, in particular, comprise annealing the deposited layer in an atmosphere containing the dopant precursor. Of course, the method may also comprise forming the CEM layer by depositing a layer of a doped metal compound and treating it to incorporate a further dopant. The treatment may, in particular, comprise annealing in an atmosphere comprising the same or a different dopant.

Note that the forming of a CEM layer comprising a doped metal compound substantially free from metal and comprising different ions of the same metal element will depend to large degree on the method and process selected as well as on apparatus, and parameters for that process, such as flow rate, temperature and pressure. It will also depend greatly on the precursor and reactant selected for a particular process as well as upon their concentrations. Detailed description covering the various possibilities is not attempted here, it being considered sufficient to point out that suitable precursors, reactants and process parameters for a particular method, process and apparatus can be determined by variation until it is seen by X-ray photoelectron spectroscopy that the formed CEM layer is substantially free from metal and comprises metal ions in different oxidation states.

Note also that the extent of doping of the CEM layer will depend in the same way and that suitable precursors, reactants and process parameters for a particular method, process and apparatus can be determined by variation until it is seen by secondary ion mass spectroscopy that the concentration of carbon or other dopant in the fully formed device is within 1 atom % and 20 atom % and, in particular, between 10 atom % and 15 atom %. This may mean providing that the concentration of dopant in the CEM layer is higher when the CEM layer is first formed as compared the concentration of dopant in the CEM layer of the fully formed device.

In general, however, the temperature utilized by the method may be between 20.0° C. and 1000.0° C., in particular, 50.0° C. and 800.0° C., for example, between 30° C. and 500° C. or between 100° C. and 400° C. The annealing may, in particular, be carried out at such temperatures for a period of between 30 seconds and 5 hours, for example, between 1 minute and 2 hours.

In a particular embodiment, the method may form a CEM layer by an atomic layer deposition utilizing separate precursor molecules, AX and BY, according to expression (4) below:

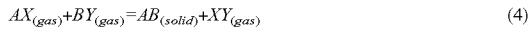

$$AX_{(gas)} + BY_{(gas)} = AB_{(solid)} + XY_{(gas)} \quad (4)$$

wherein "A" of expression (4) corresponds to a transition metal, and "AB" a transition metal compound.

In these embodiments, "X" of expression (4) may comprise a ligand, such as organic ligand comprising amidinate (AMD), cyclopentadienyl (Cp), methylcyclopentadienyl (MeCp), ethylcyclopentadienyl (EtCp), pentamethylcyclopentadienyl (Me5Cp), 2,2,6,6-tetramethylheptane-3,5-dionato (thd), acetylacetonate (acac), methylglyoximate (dmg), 2-amino-pent-2-en-4-onato (apo), 1-dimethylamino-2-methyl-2-butanolate(dmamb), 1-dimethylamino-2-methyl-2-propanolate (dmamp) and carbonyl (CO).

Accordingly, a nickel-based precursor AX may comprise, for example, nickel amidinate (Ni(AMD)), nickel dicylcopentadienyl (Ni(Cp)$_2$), nickel diethylcyclopentadienyl (Ni(EtCp)$_2$), bis(2,2,6,6-tetramethylheptane-3,5-dionato)Ni(II) (Ni(thd)$_2$), nickel acetylacetonate (Ni(acac)$_2$), bis(methyl-cyclopentadienyl)nickel (Ni(CH$_3$C$_5$H$_4$)$_2$, nickel dimethylglyoximate (Ni(dmg)$_2$), nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, bis(pentamethylcyclopentadienyl) nickel (Ni(C$_5$(CH$_5$)$_2$, and nickel carbonyl (Ni(CO)$_4$).

The precursor "BY" in expression (4) may, in particular, comprise an oxidising agent, such as water (H$_2$O), oxygen (O$_2$), ozone (O$_3$), nitric oxide (NO), hydrogen peroxide (H$_2$O$_2$) or plasma-formed oxygen radical (O.). In that case, the transition metal compound "AB" in expression (4) may be a transition metal oxide such as nickel oxide (NiO: dopant).

In other embodiments, the method may form the CEM layer utilizing precursors AX and BY and an additional dopant precursor. The additional dopant precursor may comprise ammonia (NH$_3$), methane (CH$_4$), carbon monoxide (CO) or any other molecule providing a back donating dopant in the metal compound and may co-flow with precursor AX. In that case, the CEM layer is formed according to the expression (5) may be modified to include an additional dopant ligand comprising a back-donating material substantially in accordance with expression (5), below:

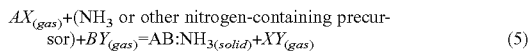

$$AX_{(gas)} + (\text{NH}_3 \text{ or other nitrogen-containing precursor}) + BY_{(gas)} = AB:\text{NH}_{3(solid)} + XY_{(gas)} \quad (5)$$

In expression (5), "BY" may comprise an oxidising agent, such as oxygen (O$_2$), ozone (O$_3$), nitric oxide (NO), hydrogen peroxide (H$_2$O$_2$) or plasma-formed oxygen radical (O.). In that case, the transition metal compound "AB" in expression (5) may be a transition metal oxide, such as nickel oxide (NiO:NH$_3$). Note that a plasma may also be used with the dopant precursor to form an activated dopant species providing for control of the concentration of the dopant in the CEM layer.

In one such embodiment, the method may form a CEM layer comprising nickel oxide doped with a carbon-containing and/or nitrogen-containing dopant (NiO:NH$_3$, for example) by an atomic layer deposition within a chamber heated to a temperature within the range 20.0° C. and 400.0° C. with exposure of the precursor gases (AX, BY, NH$_3$ or other ligand comprising nitrogen) for durations in the range of about 0.1 second and 300 seconds and purging of the precursors for durations in the range of about 0.5 seconds to 180.0 seconds.

In certain embodiments, a single atomic layer deposition two-precursor cycle (e.g., AX and BY, as described with reference to expression (4)) or a single three-precursor cycle (e.g., AX, NH$_3$, CH$_4$, or other ligand comprising nitrogen, carbon or other dopant comprising a back-donating material, and BY), as described with reference to expression (5) may bring about a CEM layer comprising a thickness approximately in the range of 0.6 Å to 5.0 Å per cycle.

Accordingly, the method may comprise forming a CEM layer of thickness of approximately 500.0 Å by 800-900 two-precursor cycles of an atomic layer deposition process forming a layer of thickness approximately 0.6 Å per cycle. Alternatively, the method may form a CEM layer of thickness approximately 500.0 Å by 100 two-precursor cycles of an atomic layer deposition process forming a layer of thickness approximately 5.0 Å per cycle.

Note, however, that the method may form a CEM layer of any suitable thickness and, in particular, a CEM layer having a thickness between 1.5 nm and 150.0 nm by an atomic layer or other deposition.

In a particular embodiment, the method may form the CEM layer by a two-precursor (for example, AX and BY) or a three-precursor (for example, AX, NH$_3$, CH$_4$ or other dopant precursor and BY) atomic layer deposition and an in situ annealing. The in situ annealing may permit an improvement of layer properties or the incorporation of dopant. It may be carried at temperatures between 20.0° C. and 1000.0° C. and in some embodiments at temperatures between 50.0° C. and 800.0° C. The duration of annealing may be between 1.0 second and 5.0 hours but in some embodiments it may be between 0.5 minutes and 180.0 minutes.

In a particular embodiment, the method may form the CEM layer by spin coating a layer of a precursor (such as AX) from a solution and annealing the layer in an atmosphere comprising an oxidising agent, such as water (H$_2$O), oxygen (O$_2$), ozone (O$_3$) at a temperature between 30° C. to 500° C. and, in particular, at a temperature between 100° C. and 400° C. The duration of annealing may be between 1.0 second and 5.0 hours and, in particular, 0.5 minutes and 180.0 minutes.

Note that the conductive substrate and/or the conductive overlay may be formed by any suitable method. Note also that other arrangements for a CEM switching device are possible including those in which one of a conductive substrate or a conductive overlay is present with the CEM layer and provided with source and drain regions.

Suitable methods for forming the conductive substrate and/or the conductive overlay comprise physical vapour deposition or chemical vapour depositions providing one or more of a transition metal or transition metal compound. The method may, in particular, form the conductive substrate and/or the conductive substrate by an atomic layer deposition or a metallo-organic chemical vapour deposition or by sputtering or reactive sputtering.

In one embodiment, the method may comprise forming the conductive substrate and/or the conductive overlay by an atomic layer deposition employing precursors having similar ligands to those mentioned above together with a reducing agent such as hydrogen or triethylsilane or an oxidising agent, such as water, oxygen or ozone. In this embodiment, the conductive substrate and/or conductive overlay may be formed as a metal or as a metal oxide. In another embodiment, the method may comprise forming the conductive substrate by sputtering or by reactive sputtering. In this embodiment, the conductive substrate and/or the conductive overlay may be formed as a metal nitride or metal silicide.

Thus, the method may form a conductive substrate and/or conductive overlay comprising, for example, one or more of titanium nitride, tantalum nitride, platinum, titanium, copper, aluminium, cobalt, nickel, tungsten, cobalt silicide, ruthenium, ruthenium oxide, chromium, gold, palladium, indium tin oxide, tantalum, silver, iridium, and iridium oxide.

In a second aspect, the present disclosure provides a CEM switching device having a layer of a correlated electron material (CEM) comprising a doped metal compound substantially free from metal wherein ions of the same metal element are present in different oxidation states. The CEM layer may, in particular, comprise less than 5 atom % or less than 2 atom % free metal—but in some embodiments, free metal is not present in the CEM layer within detectable limits obtainable by X-ray photoelectron spectroscopy.

In a particular embodiment, suitable as a CeRAM, the CEM switching device comprises a CEM layer interposed between a conductive substrate and a conductive overlay on the CEM layer, wherein the CEM layer comprises a doped metal compound substantially free from metal wherein ions of the same metal element are present in different oxidation states. The CEM layer may, in particular, be sandwiched between the conductive substrate and the conductive overlay. Note, however, that other arrangements may be possible and that, as mentioned above, the CEM switching device may comprise arrangements in which only one of a conductive substrate or a conductive overlay are provided with the CEM layer.

In another embodiment, therefore, the CEM switching device may comprise a layer of a correlated electron material (CEM) provided on a conductive substrate without a conductive overlay wherein the CEM layer comprises a metal compound substantially free from metal wherein ions of the same metal element are present in different oxidation states.

In some embodiments, the CEM switching device may comprise a CEM layer comprising a doped metal compound having two or three different ions of the same metal viz., in two or three different oxidation states. In these embodiments, the different oxidation states may be +1, +2 and +3 or +2 and +3 but other oxidation states such as +1, +3 and +5 are possible. Note that the setting of the device may lead to one or more additional different oxidation states. Note further that the difference in oxidation states need not be monotonic and that the concentrations of the metal ions of different oxidation states in the metal compound need not be equal but may differ, for example, in ratio approximating to 3:2, 4:3, 2:1 or more.

The CEM layer may comprise a metal compound of a d- or f-block element (especially one exhibiting an incomplete d- or f-electron shell) such as nickel, cobalt, iron, yttrium or ytterbium. It may, in particular, comprise an oxide of a d- or f-block element such as a transition metal oxide (TMO) or an oxide of a rare earth element, for example nickel oxide, cobalt oxide, iron oxide or yttrium oxide. The CEM layer may alternatively comprise a complex (or "mixed") oxide of d- and/or f-block elements, for example, a perovskite such as chromium doped strontium titanate, lanthanum titanate, praseodymium calcium manganate or praseodymium lanthanum manganite or a complex oxide of a rare earth element and a transition metal such as yttrium titanium oxide or ytterbium titanium oxide.

In a particular embodiment, the CEM layer comprises a doped metal compound having two or three different ions of the same metal with oxidation states of +1, +2 and +3 or with respective oxidation states +2 and +3. The CEM switching device may, for example, have a CEM layer comprising a doped transition metal, such as nickel oxide (NiO:dopant) in which the nickel ions are $Ni^+$, $Ni^{2+}$ and $Ni^{3+}$ or $Ni^{2+}$ and $Ni^{3+}$.

In one such embodiment, the CEM switching device may comprise a CEM layer formed by a doped nickel oxide (NiO:dopant) wherein the nickel $2p_{3/2}$ envelope obtained by X-ray photoelectron spectroscopy of the CEM layer is substantially absent a peak corresponding to nickel metal (at 852.1 to 853.1 eV, for example). The nickel $2p_{3/2}$ envelope may, in particular, be substantially similar to that shown in FIG. 2. In this embodiment, the oxygen is envelope obtained by X-ray photoelectron spectroscopy of the CEM layer may be substantially similar to that shown in FIG. 3.

In another embodiment, the CEM layer comprises two or three different ions of more than one transition metal viz., two or three different ions of a first metal and two or three different ions of a second metal. The CEM layer may, for example, comprise doped yttrium titanium oxide ($Y_xTi_yO$:dopant) with yttrium ions $Y^{2+}$, $Y^{3+}$ and titanium ions $Ti^{2+}$ $Ti^{3+}$ or with yttrium ions $Y^+$, $Y^{2+}$, $Y^{3+}$ and titanium ions $Ti^+$, $Ti^{2+}$, $Ti^{3+}$. Note that the oxidations states of the ions of the different metals need not correspond and that other oxidation states such as $Ti^{4+}$ may also be present.

The CEM layer may be doped with a dopant which can donate electrons to the metal compound. As mentioned above, such "back-donating" may provide that the CEM layer exhibits the property of a controllable and reversible donation of electrons to a conduction band of the metal compound during operation of the device thus permitting the metal compound to switch between a relatively conductive state and a relatively insulative state.

Such back donating dopants may comprise carbon-containing, nitrogen-containing, sulfur-containing, halogen or phosphorus-containing dopants. Suitable dopants may arise from doping with precursors such as carbon monoxide (CO), halogen (for example, chlorine), ammonia ($NH_3$) or amine ($NR_3$, R=H or alkyl or aryl), such as ethylene diamine ($C_2H_8N_2$), as well as nitrogen oxides of formula $N_xO_y$, viz., nitrous oxide, nitric oxide or nitrogen dioxide. Suitable nitrogen-containing dopant precursors may conform to the formula CxHyNz (in which x,y≥0 and N≥1) and these include ammonia, ethylenediamine, cyano ($CN^-$), azide ($N_3^-$), phen(1,10-phenanthroline), pyridine, 2-2-bipyridine, acetonitrile ($CH_3CN$) and cyanosulfanides such as thiocyanate ($NCS^-$).

Other suitable back donating dopants may arise from an organometallic precursor for the metal compound comprising one or more of a carbon-containing ligand, a nitrogen-containing ligand, halogen, a phosphorus-containing ligand or a sulfur-containing ligand. Such ligands include carbonyl (—CO), chloro (—Cl), amine (—NH$_3$), alkyl amide (—NR$_3$), sulphide (—SR) and phosphine (—PR$_3$ R=aryl, for example, phenyl) as well as more complex ligands such as amidinate (AMD), cyclopentadienyl (Cp), methylcyclopentadienyl (MeCp), ethylcyclopentadienyl (EtCp), pentamethylcyclopentadienyl (Me$_5$Cp), 2,2,6,6-tetramethylheptane-3,5-dionato (thd), acetylacetonate (acac), methylglyoximate (dmg), 2-amino-pent-2-en-4-onato (apo), 1-dimethylamino-2-methyl-2-butanolate(dmamb), 1-dimethylamino-2-methyl-2-propanolate (dmamp).

In particular embodiments, the CEM switching device comprises a CEM layer comprising a doped metal compound wherein the content of carbon or nitrogen (for example) is between 1 atom % and 20 atom %, in particular, between 5 atom % and 20 atom %, for example, 10 atom % or 15 atom % or over. In one such embodiment, wherein the CEM layer is formed as a doped nickel oxide (NiO:dopant) the carbon content may derive from carbon monoxide gas or from a carbonyl (—CO) ligand in an organometallic precursor.

The CEM switching device may, in particular, comprise a CEM layer formed as a nickel oxide (NiO:CO) wherein the nickel 2p$_{3/2}$ envelope obtained by X-ray photoelectron spectroscopy of the CEM layer is substantially similar to that shown in FIG. 2, the oxygen is envelope obtained by X-ray photoelectron spectroscopy of the CEM layer may be substantially similar to that shown in FIG. 3 and the carbon is envelope obtained by X-ray photoelectron spectroscopy may be substantially similar to that shown in FIG. 4.

In certain embodiments, the CEM switching device comprises a CEM layer which is "born on" viz., a CEM layer that is formed in its comparatively conductive (low resistance) state. The CEM layer formed as a doped nickel oxide (NiO:CO) and described by FIGS. 2 to 4 is one example of a born on CEM layer. As mentioned above, this CEM layer has two different nickel ions in oxidation states +2 and +3 and contains no nickel metal. These different oxidation states of nickel ion may be associated with different conducting (or insulative states) in the CEM layer. In particular, the switching of the CEM layer from its relatively conducting state to its relatively insulating state may be associated with a disproportionation of nickel ions in oxidation state +2 to nickel ions in oxidation states +1 and +3 ($Ni^{2+}$=$Ni^+$+$Ni^{3+}$. Conversely, the switching of the CEM layer from its relatively insulating state to its relatively conducting state may be associated with a comproportionation of nickel ions in oxidation states +1 and +2 to nickel ions in oxidation state +2 ($Ni^+$+$N^{3+}$=$Ni^{2+}$. In that case, nickel ion in oxidation state +1 will not appear in the CEM layer until the device has been "set" by switching for the first time.

Note that a CEM layer comprising two or three different ions of more than one metal may switch through concomitant disproportionation and/or comproportionation of ions of both metals. The switching of the CEM layer from its relatively conducting state to its relatively insulating state may, in particular, be associated with a disproportionation of an ion of a first metal (Y, for example) as well as a disproportionation of an ion of a second metal (Ti, for example). Conversely, the switching of the CEM layer from its relatively insulating state to its relatively conducting state may be associated with a comproportionation of an ion of a first metal (Y, for example) as well as a comproportionation of an ion of a second metal (Ti, for example).

The thickness of the CEM layer (for example, the doped nickel oxide (NiO:CO) just described) in the CEM switching device may be between 1.5 nm and 150.0 nm—but other suitable thicknesses are possible.

The conductive substrate and/or the conductive overlay may comprise one or more of titanium nitride, tantalum nitride, tungsten nitride, platinum, titanium, copper, aluminium, cobalt, nickel, tungsten, cobalt silicide, ruthenium oxide, chromium, gold, palladium, indium tin oxide, tantalum, silver, iridium and iridium oxide. In one embodiment, the switching device comprises a CEM layer (for example, the doped nickel oxide NiO:CO just described) formed on a platinum electrode. In this embodiment, a conductive overlay provided on the CEM layer may comprise platinum or titanium nitride electrode.

In particular embodiments, the CEM switching device may be capable of switching at operating voltages of 2.0V or less. Such low voltages are obtained when the CEM layer comprises metal ions providing an appropriate distribution of oxidation states and dopant level supporting orbital switching.

Further embodiments of the presently disclosed CEM switching device and methods for its manufacture will be apparent from the following description and Figures in which FIG. 1A shows a schematic illustration of a current density versus voltage profile of a CEM switching device;

Figure 1A:
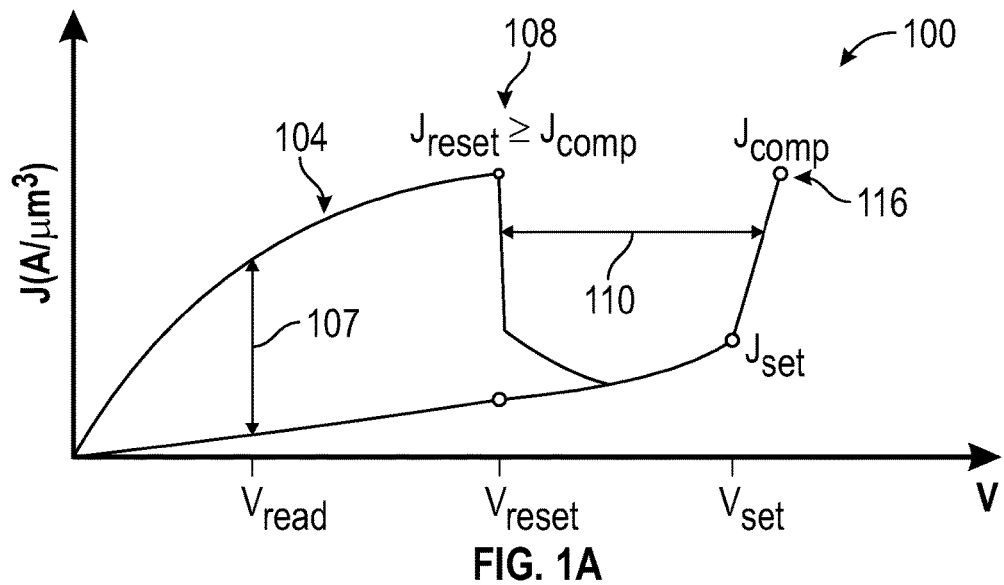
FIG. 1B shows a schematic illustration of the CEM switching device of FIG. 1A and a schematic diagram of an equivalent circuit for the switching device.
Figure 1B:
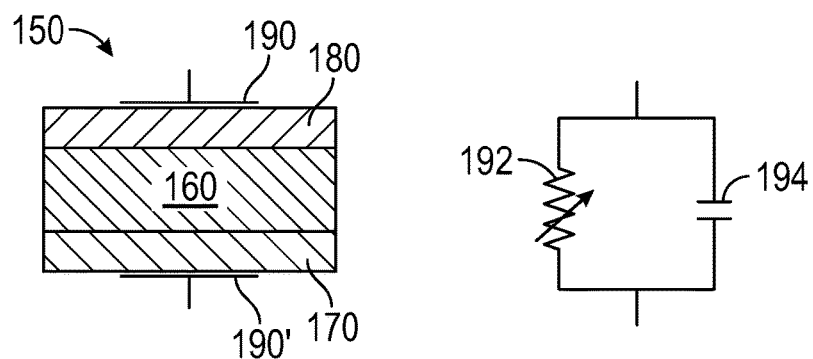
Figure 2:
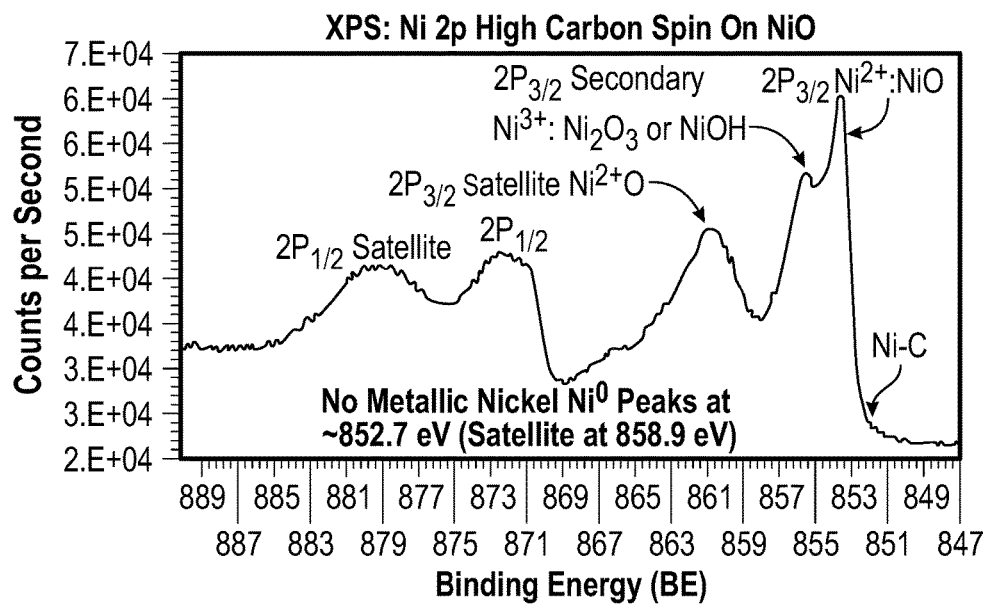
FIG. 2 shows a graph obtained by X-ray photoelectron spectroscopy (XPS) reporting the nickel 2p envelope of the CEM layer of the device.
Figure 3:
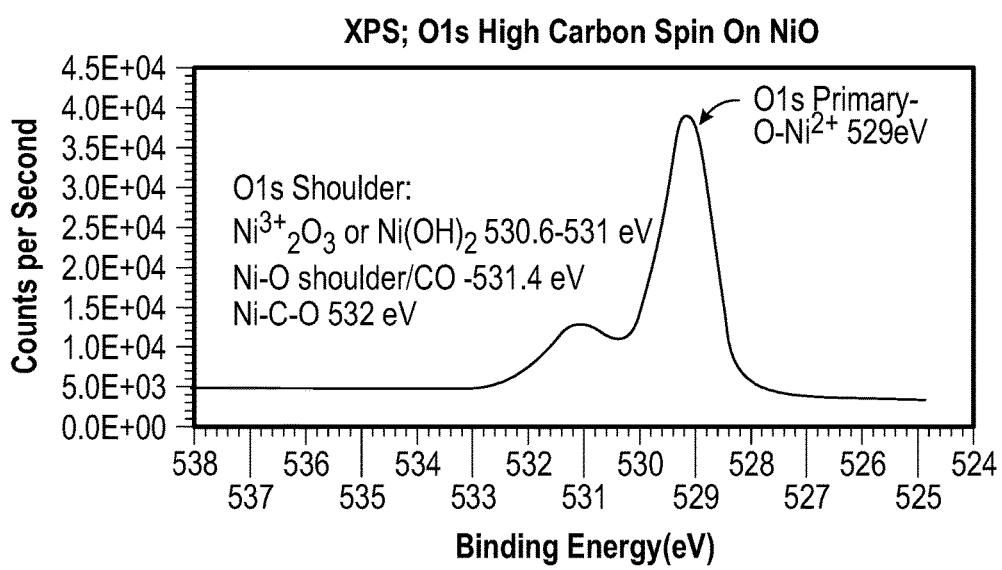
FIG. 3 shows a graph obtained by XPS reporting the oxygen is envelope of the CEM layer of the device.

FIGS. 2 and 3 show the results of an X-ray photoelectron spectroscopic (XPS) analysis of a thin film of doped nickel oxide formed on a platinum electrode. The doped nickel oxide film may be formed by spin coating a solution of dicyclopentadienyl nickel in an organic solvent and annealing the coating in an atmosphere comprising oxygen and carbon monoxide at a temperature between 30° C. and 500° C., in certain embodiments between 100° C. and 400° C. during 30 seconds to 5 hours, in some embodiments during 1 minute to 2 hours.

The XPS analysis may be carried out using a monochromatic Al K$_\alpha$ source (1486.6 eV) and charge correction to carbon is 284.8 eV. The acceptance angle may be +/−23° and the take-off angle may be 75°. The ion gun may, in particular, comprise Ar$^+$ at 1 keV and 3×3 raster. The analysis area may, for example, be 1400 μm by 300 μm. The analysis may utilise Casa XPS software (version 2.3.14) and a standard Shirley background correction (2p$_{3/2}$).

Referring now to FIG. 2, the XPS spectrum for the nickel 2p envelope (based on 2p$_{3/2}$) shows a primary peak between 853 eV and 854 eV and a secondary peak between 855 eV and 856 eV. The primary peak has a satellite peak between 860 and 861 eV and these peaks are consistent with reported values for nickel 2+ ion (854.6 eV). The secondary peak is consistent with reported values of Ni 3+ ion (856.1 eV or nickel hydroxide). Those skilled in the art will appreciate that the spectrum is absent a peak consistent with free nickel metal (reported to be between 852.1 to 853.1 eV).

Referring now to FIG. 3, the XPS spectrum for the oxygen is envelope shows a primary peak at 529 eV having a shoulder between 530 eV and 533 eV. The primary peak is consistent with reported values indicating nickel 2+ ion and the shoulder is consistent with nickel 3+ ion (or nickel hydroxide).

Both spectra compare well to those shown by Biesinger, M. C. et al., in Surf. Interface Anal. 2009, 41, 324 to 332 for pure samples of nickel oxide and nickel hydroxide. A comparison with this literature suggests that the film is predominantly nickel oxide, viz. the predominant ion is nickel 2+ as compared to nickel 3+.

Figure 4:
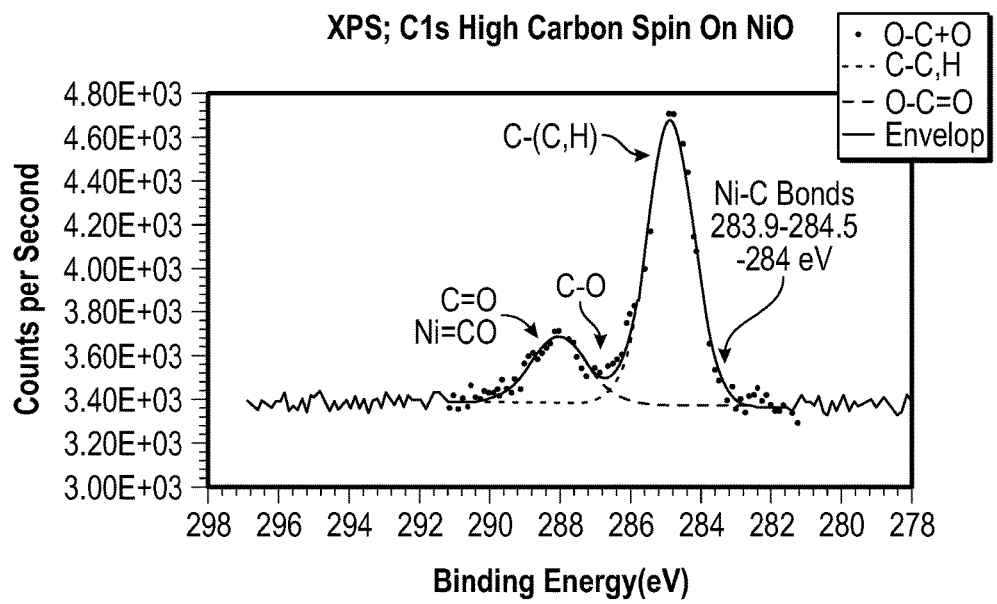
FIG. 4 shows a graph obtained by XPS reporting the carbon is envelope of the CEM layer of the device.

Referring now to FIG. 4, the XPS spectrum for the carbon is envelope shows a primary peak between 283 eV and 287 eV with a shoulder starting at 287 eV and ending at 290 eV. The spectrum is consistent with a carbonyl ligand (—CO) species as described by Owings R. R in PhD Thesis "Polarons and Impurities in Nickel Cobalt Oxide" at University of Florida (2003). The primary peak (at about 284.8) is assigned to nickel-carbon and carbon-carbon bonding whilst the shoulder is assigned to nickel-carbon and carbon-oxygen bonding.

These spectra taken together indicate that the film essentially comprises a highly (carbon) doped nickel oxide film comprising nickel 2+ ion and nickel 3+ ion and is absent free nickel metal.

Figure 5:
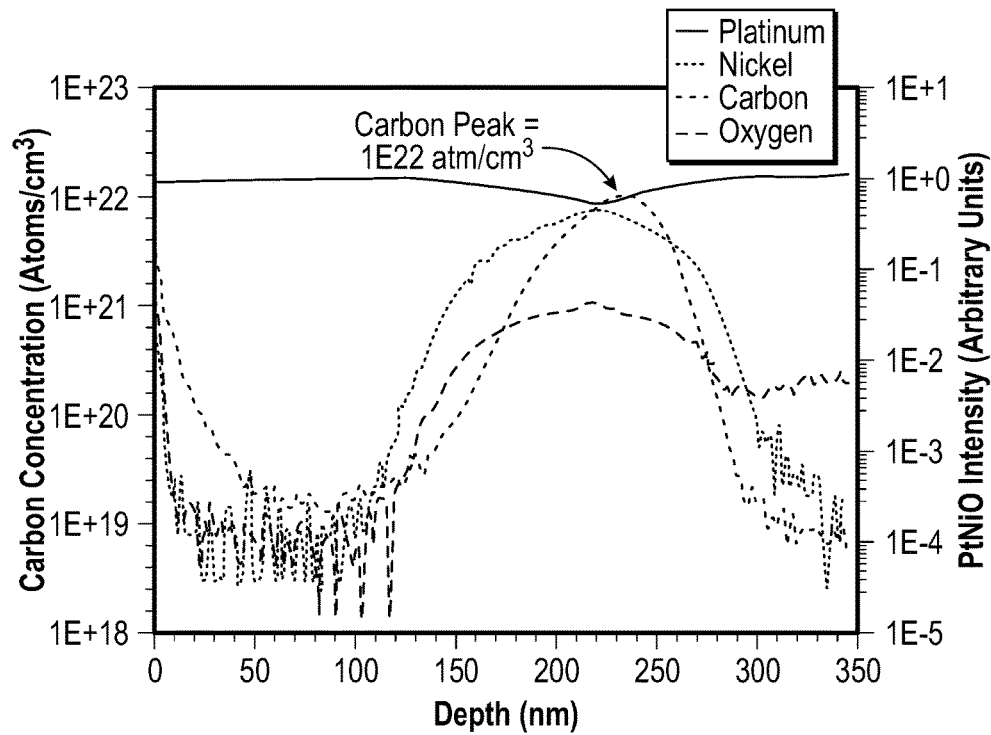
FIG. 5 shows a graph obtained by secondary ion mass spectroscopy (SIMS) reporting the carbon content of the CEM layer of the device.

FIG. 5 shows the results of a secondary ion mass spectroscopy (SIMS) analysis of a fully formed CEM switching device comprising the nickel oxide film as CEM layer. The graph corresponds to the structural profile of the switching device described above wherein intervening layers comprising silica and titanium oxide ($TiO_x$) are provided between the silicon substrate and its platinum electrode. These layers are provided respectively to isolate the silicon substrate from the device and for better adhesion of its platinum electrode.

The two ordinate axes indicate the relative content of nickel, silicon and other elements (LHS) as compared to the absolute concentration of carbon (LHS). As may be seen, the peak concentration of carbon is in the CEM (nickel oxide) layer and at $1\times10^{22}$ atom per cm$^3$.

Figure 6:
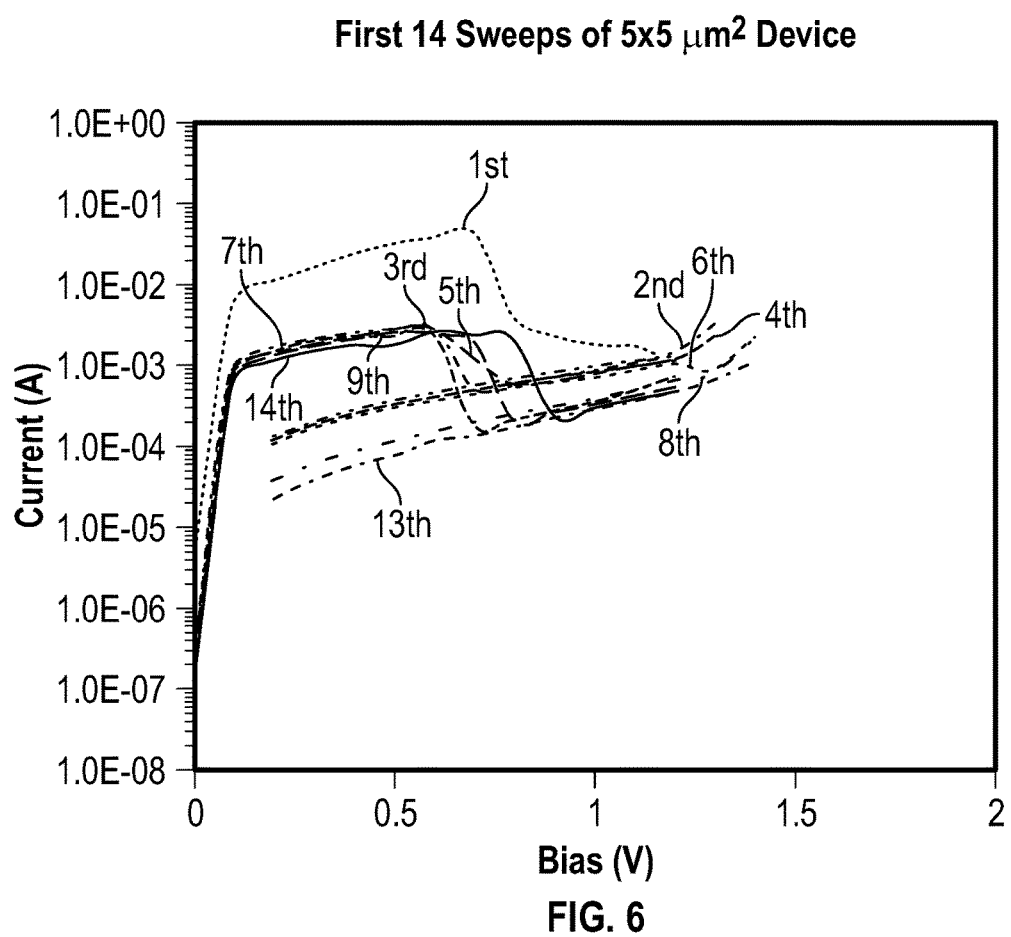
FIG. 6 shows a (part) current density versus voltage profile for the device.

Referring now to FIG. 6, a (part) current versus voltage profile for the first 14 sweeps of the switching device (in which the CEM film has area 5 μm by 5 μm) shows that the nickel oxide (NiO:CO) film is a CEM layer which is born on and has switching properties suitable for a CeRAM device at operating voltages below 2.0V.

Figure 7:
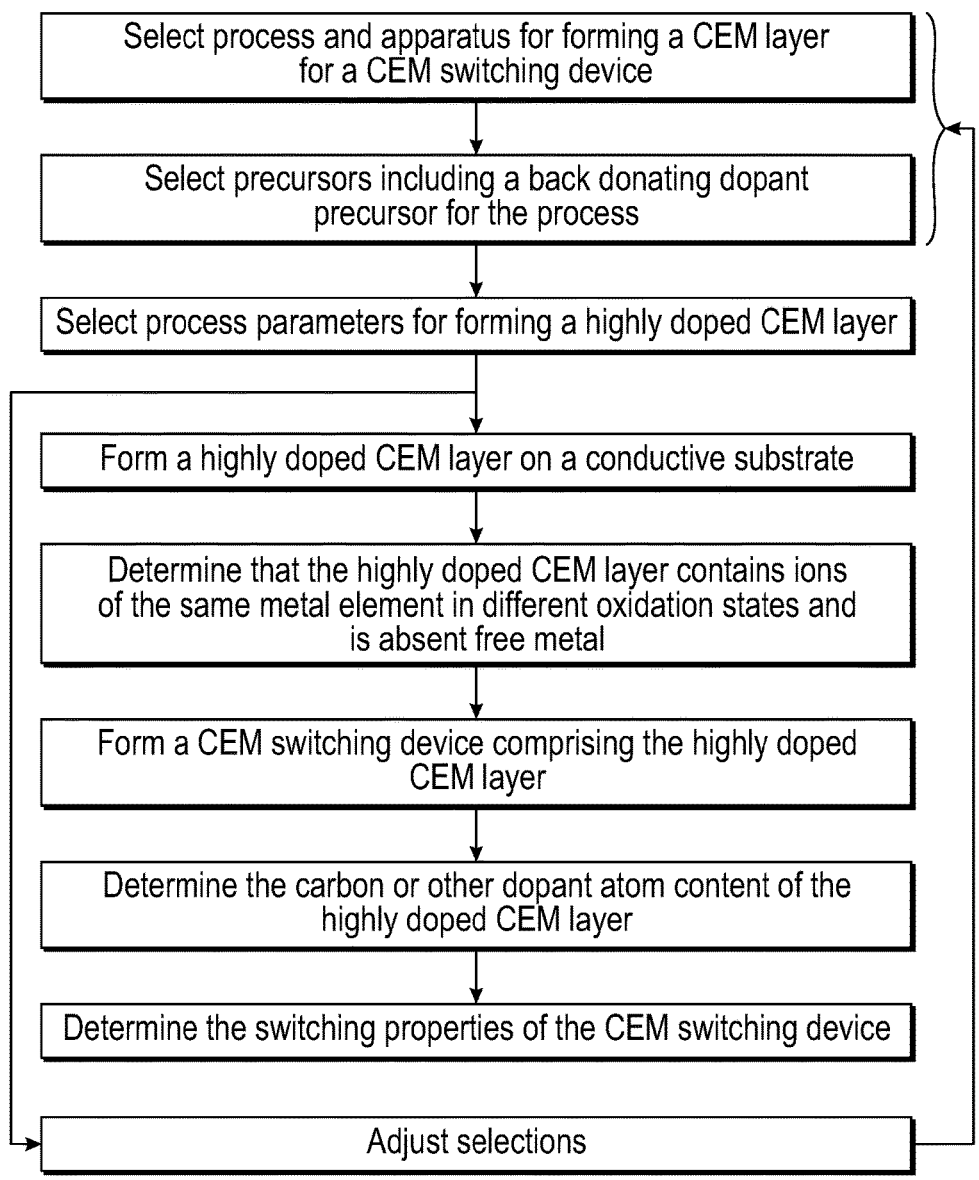
FIG. 7 shows a flow chart generally illustrating the manufacture of the device.

FIG. 7 is a flow diagram showing a scheme for obtaining a CEM switching device according to the present disclosure. As mentioned above the forming of a CEM layer comprising a doped metal compound substantially free from metal and comprising different ions of the same metal element will depend to large degree on the method and process selected as well as on apparatus, and parameters for that process, such as flow rate, temperature and pressure.

It will also depend greatly on the precursor and reactant selected for a particular process as well as upon their concentrations. Once a particular method has been selected, for example, forming the CEM layer with direct incorporation of a dopant from an organometallic precursor and an oxidising agents, a suitable process, such as an atomic layer deposition is adopted and a highly doped CEM film is deposited on a chosen conductive substrate, such as a platinum electrode.

The highly doped CEM film is examined by X-ray photoelectron spectroscopy and the metal ion species determined by comparison with literature or with pure samples of compounds containing a corresponding single metal ion species. The X-ray photoelectron spectroscopy also determines the presence or not of free metal by comparison with literature or a pure sample of the corresponding metal.

The level of doping of the CEM film is chosen to be high in order to compensate for any loss of the dopant from the CEM layer in the subsequent steps necessary for manufacturing the CEM switching device. The level is, however, not examined here but only in the fully formed device and by secondary ion mass spectroscopy (SIMS).

If free metal is found in the CEM film, other CEM films are formed on the chosen conductive substrate using, for example, different concentrations of reactants such as oxidising agent, different temperatures and/or pressures and different flow rates until a highly doped CEM film is found which is substantially absent free metal.

If the metal ion species in the CEM film is determined to be consistent with orbital switching so that low operating voltages are likely the selected precursors, process and process parameters may be adopted for the manufacture of a CEM switching device. A conductive overlay may be deposited on the CEM film and other subsequent steps (such as etching) may be taken to produce a fully formed CEM switching device according to a particular requirement.

When the CEM switching device is first formed, the level of dopant in the CEM film is examined by secondary ion mass spectroscopy (SIMS) and if the level of dopant is judged to be high as compared to the CEM layer when it is first formed, the CEM switching device is tested for its switching properties and, in particular, for switching at low operating voltages, for example, between 0 and 4V, in particular, between 0 and 2V.

If, however, the level of doping is judged unlikely to support orbital switching at low operating voltages, or the switching properties of the device are found to require comparatively high operating voltages (or are otherwise unsatisfactory), further CEM films may be formed on the chosen substrate using a different organometallic precursor and/or an additional dopant precursor.

Of course, the process parameters, such as those mentioned above, may be adjusted as described above until a highly doped CEM film containing appropriate metal ions and substantially no free metal is found. In that case, a new CEM switching device is formed as described above and the level of dopant re-examined.

Such steps are repeated until a CEM switching device comprising CEM layer comprising a highly doped metal compound substantially free from metal and comprising different ions of the same metal element is obtained. The level of carbon or other atom dopant is the CEM switching device may, in particular, be between 5 atom % and 20 atom %, for example, over 10 atom % or 15 atom %.

Note that references in this disclosure reporting a range, such as "between 100° C. and 400° C." include references to start and end values, for example 100° C. and 400° C.

Note further that references in this disclosure to a metal compound do not necessarily require a particular stoichiometry and include references to compounds which may at times be considered to be a mixture of compounds, such as a mixture of oxides.

Note also that references in this disclosure to a CEM layer comprising a doped metal compound include references to a CEM layer formed by more than one such metal compound, for example, two or three. A CEM layer formed by layers of two or three such metal compounds may, in particular, comprise different metals and the oxidation states of the different ions of the respective metals may differ as between those metals.

what is claimed is:

1. A CEM switching device comprising a conductive substrate, a conductive overlay and a layer of a correlated electron material (CEM) interposed there between wherein the CEM layer comprises a doped compound of a d- or f-block element comprising ions of the same d- or f-block element in different oxidation states and less than 5 atom % of free d- or f-block element, the free d- or f-block element being unbound and in a zero oxidation state.

2. A CEM switching device according to claim 1, wherein the compound comprises two different ions of the same d- or f-block element and the different oxidation states are +2 and +3.

3. A CEM switching device according to claim 1, wherein the compound comprises three different ions of the same d- or f-block element and the different oxidation states are +1, +2 and +3.

4. A CEM switching device according to claim 1, wherein the compound comprises two different ions of the same d- or f-block element in ratio between 1:5 and 5:1.

5. A CEM switching device according to claim 1, wherein the compound comprises nickel oxide containing nickel ions in oxidation states +2 and +3.

6. A CEM switching device according to claim 5, wherein the nickel oxide contains nickel ions in oxidation state +1.

7. A CEM switching device according to claim 1, wherein the CEM layer is doped with a dopant providing a back-donating ligand.

8. A CEM switching device according to claim 1, wherein the CEM layer is born on.

9. A CEM switching device according to claim 1, wherein the switching voltage of the device is less than or equal to 2.0 V.

10. A CEM switching device according to claim 1, wherein the compound comprises one or more of an oxide of aluminum, cadmium, chromium, cobalt, copper, gold, iron, manganese, mercury, molybdenum, nickel, palladium, rhenium, ruthenium, silver, tantalum, tin, titanium, vanadium, yttrium, ytterbium and zinc.

11. A CEM switching device according to claim 10, wherein the oxide is doped by a carbon-containing or nitrogen-containing dopant.

* * * * *